United States Patent
Gopal et al.

(10) Patent No.: US 9,594,634 B2
(45) Date of Patent: Mar. 14, 2017

(54) TECHNIQUES TO EFFICIENTLY COMPUTE ERASURE CODES HAVING POSITIVE AND NEGATIVE COEFFICIENT EXPONENTS TO PERMIT DATA RECOVERY FROM MORE THAN TWO FAILED STORAGE UNITS

(71) Applicant: Intel Corporation, Santa Clara, CA (US)

(72) Inventors: Vinodh Gopal, Westborough, MA (US); Erdinc Ozturk, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 237 days.

(21) Appl. No.: 14/293,791

(22) Filed: Jun. 2, 2014

(65) Prior Publication Data

US 2015/0347231 A1  Dec. 3, 2015

(51) Int. Cl.
| | |
|---|---|
| G06F 11/10 | (2006.01) |
| G06F 11/00 | (2006.01) |
| H03M 13/15 | (2006.01) |
| H03M 13/00 | (2006.01) |
| H03M 13/37 | (2006.01) |

(52) U.S. Cl.
CPC ....... *G06F 11/1088* (2013.01); *H03M 13/159* (2013.01); *H03M 13/1515* (2013.01); *H03M 13/373* (2013.01); *G06F 2211/1057* (2013.01)

(58) Field of Classification Search
None
See application file for complete search history.

(56) References Cited

U.S. PATENT DOCUMENTS

| | | | | |
|---|---|---|---|---|
| 7,219,289 B2* | 5/2007 | Dickson | ............. | G06F 11/1076 714/752 |
| 7,581,156 B2* | 8/2009 | Manasse | ............ | H03M 13/1515 714/781 |
| 7,664,915 B2 | 2/2010 | Gopal et al. | | |
| 8,145,941 B2* | 3/2012 | Jacobson | ............. | G06F 11/1076 714/6.24 |

(Continued)

OTHER PUBLICATIONS

RAID, from Wikipedia, the free encyclopedia, Retrieved Jun. 1, 2014.

(Continued)

*Primary Examiner* — Justin R Knapp
(74) *Attorney, Agent, or Firm* — Barnes & Thornburg LLP

(57) ABSTRACT

Erasure code syndrome computation based on Reed Solomon (RS) operations in a Galois field to permit reconstruction of data of more than 2 failed storage units. Syndrome computation may be performed with coefficient exponents that consist of $-1$, 0, and 1. A product xD of a syndrome is computed as a left-shift of data byte D, and selective compensation based on the most significant bit of D. A product $x^{-1}D$ of a syndrome is computed as a right-shift of data byte D, and selective compensation based on the most significant bit of D. Compensation may include bit-wise XORing shift results with a constant derived from an irreducible polynomial associated with the Galois field. A set of erasure code syndromes may be computed for each of multiple nested arrays of independent storage units. Data reconstruction includes solving coefficients of the syndromes as a Vandermonde matrix.

25 Claims, 9 Drawing Sheets

(56) References Cited

U.S. PATENT DOCUMENTS

| | | | |
|---|---|---|---|
| 8,219,887 B2* | 7/2012 | Pruthi | G06F 11/1076 714/52 |
| 8,386,891 B2* | 2/2013 | Hetzler | G06F 11/008 714/777 |
| 8,522,122 B2* | 8/2013 | Alves | G06F 11/10 714/758 |
| 2004/0117718 A1* | 6/2004 | Manasse | H03M 13/1515 714/781 |
| 2009/0199075 A1* | 8/2009 | Demjanenko | H03M 13/158 714/784 |

OTHER PUBLICATIONS

Storage Networking Industry Association, 2013 SNIA Dictionary, A glossary of storage networking, data, and information management terminology, Feb. 25, 2013, v.2013.2.ENG, San Francisco, CA, US.
Standard RAID Levels, from Wikipedia, the free encyclopedia, Retrieved Dec. 2, 2013.
Westall, James & Martin, James, An Introduction to Galois Fields and Reed-Solomon Coding, Oct. 4, 2010, Clemson University School of Computing, Clemson, SC, US.

\* cited by examiner

TECHNIQUES TO EFFICIENTLY COMPUTE ERASURE CODES HAVING POSITIVE AND NEGATIVE COEFFICIENT EXPONENTS TO PERMIT DATA RECOVERY FROM MORE THAN TWO FAILED STORAGE UNITS

TECHNICAL FIELD

Reconstruction of data stored in a subset of failed storage units within an array of storage units.

BACKGROUND

An erasure code is a forward error correction (FEC) code that transforms a message of x symbols into a longer message, or code word, with y code word symbols such that the original message can be recovered from a subset of the y code word symbols. An erasure code is referred to an optimal erasure code if x of the n code word symbols are sufficient to recover the original message. Optimal erasure codes are maximum distance separable codes (MDS codes).

An optimal erasure code may be based on a parity check-sum and/or polynomial interpolation with points computed over a finite field. Polynomial interpolation may be implemented with Reed-Solomon FEC encoding, with code words constructed over a finite field using a Vandermonde matrix.

RAID is a data storage virtualization technology that combines multiple disk drive components into a logic unit to improve performance (e.g., reduce access times) and/or to provide data recoverability, also referred to herein as data reliability and/or data resiliency. The term "RAID" was introduced by David Patterson, Garth A. Gibson, and Randy Katz at the University of California, Berkeley in 1987, as an acronym for a redundant array of inexpensive disks. RAID is also used as an acronym for a redundant array of independent disks.

RAID standards have been published as a Common RAID Disk Drive Format (DDF) by the Storage Networking Industry Association (SNIA), of San Francisco, Calif. RAID standards currently include RAID 0 through RAID 6. Non-standard RAID configurations are discussed in literature.

RAID 6 is "[a]ny form of RAID that can continue to execute read and write requests to all of a RAID array's virtual disks in the presence of any two concurrent disk failures. Several methods, including dual check data computations (parity and Reed-Solomon), orthogonal dual parity check data and diagonal parity, have been used to implement RAID Level 6." (The 2013 SNIA Dictionary, v. 2013.2.ENG, SNIA, San Francisco, Calif.). RAID 6 thus provides data resiliency for up to 2 disk failures.

For RAID 6, two syndromes, P and Q, are computed to permit recovery from a loss of any two drives. Syndrome P may be computed as an XOR of the data across the stripes with relatively little processor overhead. Syndrome Q is more complicated and may be computed with field theory.

BRIEF DESCRIPTION OF THE DRAWINGS

For illustrative purposes, one or more features disclosed herein may be presented and/or described by way of example and/or with reference to one or more drawing figured listed below. Methods and systems disclosed herein are not, however, limited to such examples or illustrations.

Figure 1:
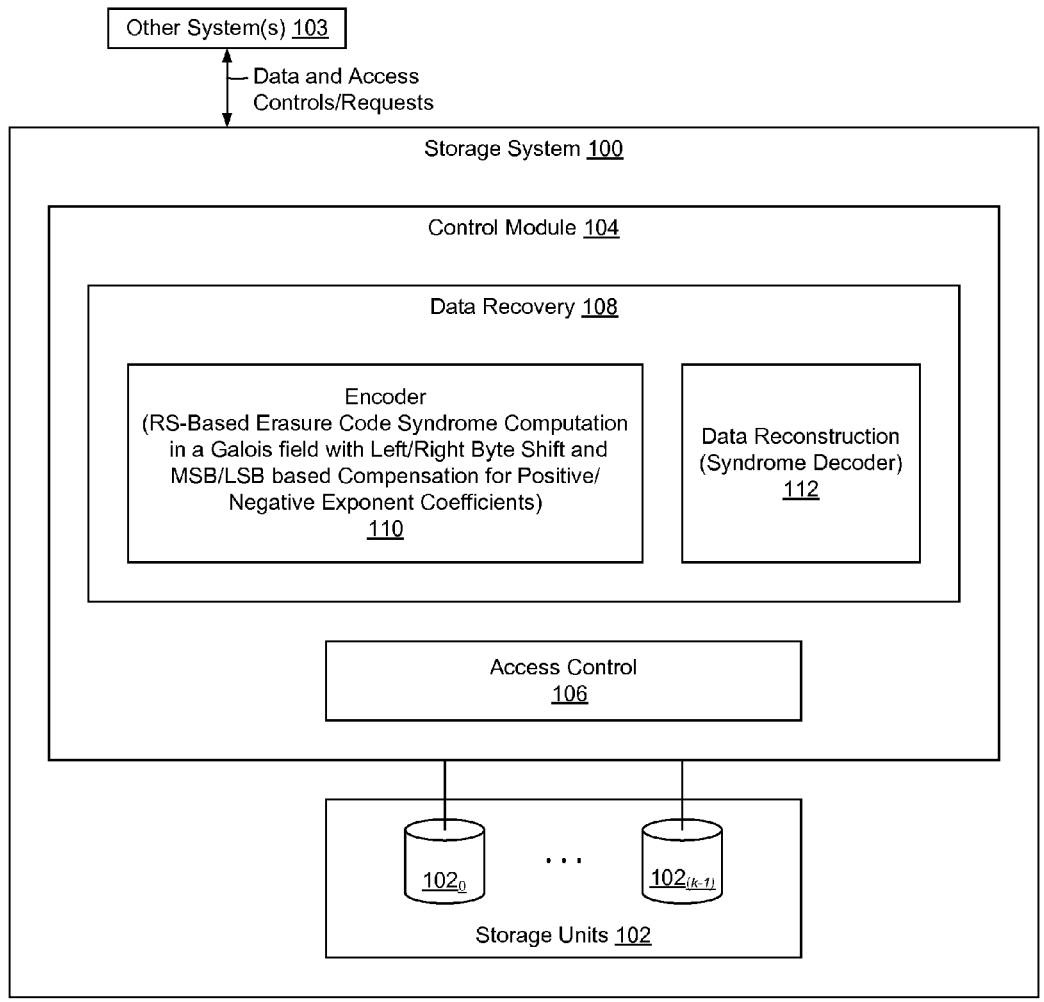
FIG. 1 is a block diagram of a storage system that includes k storage units and a control module that includes an access control module to distribute data over the k storage units and present the k storage units as a single logical device, and a data recovery module to compute erasure code syndromes in a Galois field to permit recovery of data from up to m of the k storage units, where the syndromes include positive and negative coefficient exponents, based on relatively efficient computational techniques that scale with m for m greater than 2.

In the drawings, the leftmost digit(s) of a reference number identifies the drawing in which the reference number first appears.

DETAILED DESCRIPTION

The term storage device, as used herein, refers to circuitry and media configured to retain data (e.g., digital) data, such as computer program instructions and/or other computer readable information. A storage device may include, without limitation, an electro-mechanically driven storage device (e.g., a hard disk drive and/or magnetic tape storage device), and/or a solid-state storage device (e.g., a flash memory device).

The term storage unit, as used herein, may represent an individual storage device or a group, cluster, or layer of multiple storage devices, examples of which are provided further below.

Methods and systems are disclosed herein to provide data resiliency in a storage system configured to distribute data over multiple storage devices, including to recover or reconstruct data of up to m of the storage units, where m may be greater than 2.

As described further above, RAID 6 provides data resiliency for up to two disk failures. Additional resiliency (e.g., for more than 2 disk failures), may be warranted for one or more of a variety of reasons, such as to address increasing storage volumes/capacities, distributed file/object storage and usages, and/or contractual obligations (e.g., data availability/resiliency obligations of a data center or cloud storage service provider). As an example, workload and failure analysis data generated with respect to a widely used cloud-based storage system that utilizes conventional data recovery tools reveals a substantial risk of data loss due to failure groupings and failure bursts (correlated failures). Methods and systems disclosed herein may be used to provide data resiliency for more than two disk failures, relatively efficiently.

FIG. 1 is a block diagram of a storage system 100 that includes k storage units 102 and a control module 104. Control module 104 includes an access control module 106 to present storage units 102 as a single logical device to one or more other systems 103. Access control module 106 may be configured to distribute data across storage units 102 in accordance with one or more standard and/or non-standard RAID configurations.

Storage system 100 may be accessible to a single computer system (e.g., as a local storage system) and/or multiple computer systems (e.g., a centralized and/or distributed data storage center and/or a cloud-based storage system).

Control module 104 further includes a data recovery module 108 to recover or reconstruct data in the event of a failure of a subset of storage units 102. A failure may include a technical failure of a storage unit 102 (e.g., device failure, communication failure, and/or loss of power), and/or physical inaccessibility to a storage unit 102 (e.g., due to physical/personal safety risks that may arise from natural conditions and/or human-initiated events).

Data recovery module 108 includes an erasure code module, illustrated in FIG. 1 as an encoder 110 to compute erasure code syndromes in a Galois field based on data stored in storage units 102, and a data reconstruction module 112 to recover or reconstruct data of a subset of storage units 102 based on the erasure code syndromes and data in remaining storage units 102.

Encoder 110 is configured to compute m erasure code syndromes in a Galois field to permit data recovery in the event of a failure of up to m of the k storage units 102, where k and m are positive integers, and k is greater than m. In an embodiment, m is greater than 2 such that encoder 110 is configured to permit data recovery from m≥3 failed storage units 102.

Encoder 110 may be configured to compute erasure code syndromes that have positive coefficient exponents, and erasure code syndromes that have negative coefficient exponents, using a technique that scales with m for m>3 (i.e., EC3+), with lower computational expense relative to techniques that use only positive coefficient exponents.

In an embodiment, encoder 110 is configured to compute the m syndromes with coefficient exponents that consist of integer values −1, 0, and 1 (i.e., coefficient exponents greater than 1 are factored out of the syndromes). This may simplify syndrome computation.

In an embodiment, encoder 110 is configured to compute xD of a syndrome, in the Galois field, with a left shift of D and selective compensation of the shift result based on a value of a most significant bit (MSB) of D, where D represents a set of data (e.g., a data byte stripes across storage units 202).

In an embodiment, encoder 110 is configured to compute $x^{-1}D$ of a syndrome, in the Galois field, with a right shift of D, and to selectively compensate the result based on a value of a least significant bit (LSB) of D.

Compensation may include bit-wise XORing a shift result with a constant derived from an irreducible polynomial associated with the Galois field.

Storage system 100 may be configured as described in one or more examples below. Storage system 100 is not however, limited to the examples below.

Figure 2:
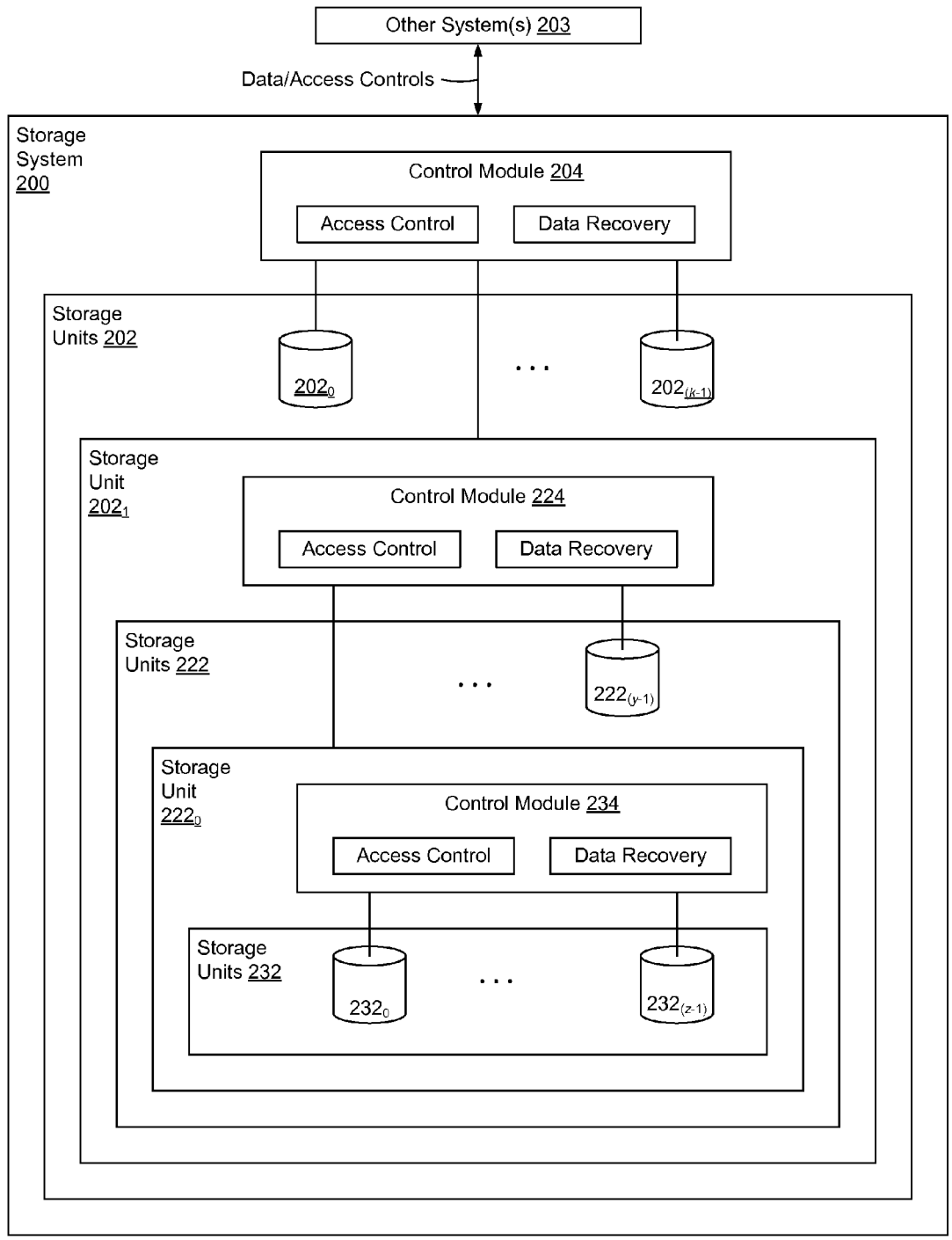
FIG. 2 is a block diagram of a multi-tiered storage system that includes per-tier data recovery modules.

FIG. 2 is a block diagram of a multi-tiered storage system 200. Storage system 200 includes multiple storage units 202, and a control module 204. Control module 204 includes an access control module to manage storage units 202, including to present storage units 202 as a single logical device to one or more other systems 203. Control module 204 further includes a data recovery module to recover or reconstruct data in the event of a failure of a subset of storage units 202, such as described above with respect to data recovery module 108 in FIG. 1.

Storage system 200 includes storage units $202_0$ through $202_{k-1}$. In the example of FIG. 2, storage unit $202_1$ includes multiple storage units 222 and a control module 224. Control module 224 includes an access control module to manage storage units 222, including to present storage units 222 as a single logical device to control module 204. Control module 224 further includes a data recovery module to recover or reconstruct data in the event of a failure of a subset of storage units 222, such as described above with respect to data recovery module 108 in FIG. 1.

Storage units 222 include storage units $222_0$ through $222_{y-1}$. In the example of FIG. 2, storage unit $222_0$ includes multiple storage units 232 and a control module 234. Control module 234 includes an access control module to manage storage units 232, including to present storage units 232 as a single logical device to control module 224. Control module 234 further includes a data recovery module to recover or reconstruct data in the event of a failure of a subset of storage units 232, such as described above with respect to data recovery module 108 in FIG. 1.

In FIG. 2, each set of storage units, 202, 222, and 232, represent a layer, group, or cluster of nested storage devices, which may be defined and/or segregated based on, for example and without limitation, storage device type, users/user groups, geographic location, and/or facility related features (e.g., floor, room, power grid block, and/or cooling grid block).

Storage system 100 (FIG. 1) and/or storage system 200 (FIG. 2) may be configured as described below with reference to FIG. 3. Storage systems 100 and 200 are not, however, limited to the example of FIG. 3.

Figure 3:
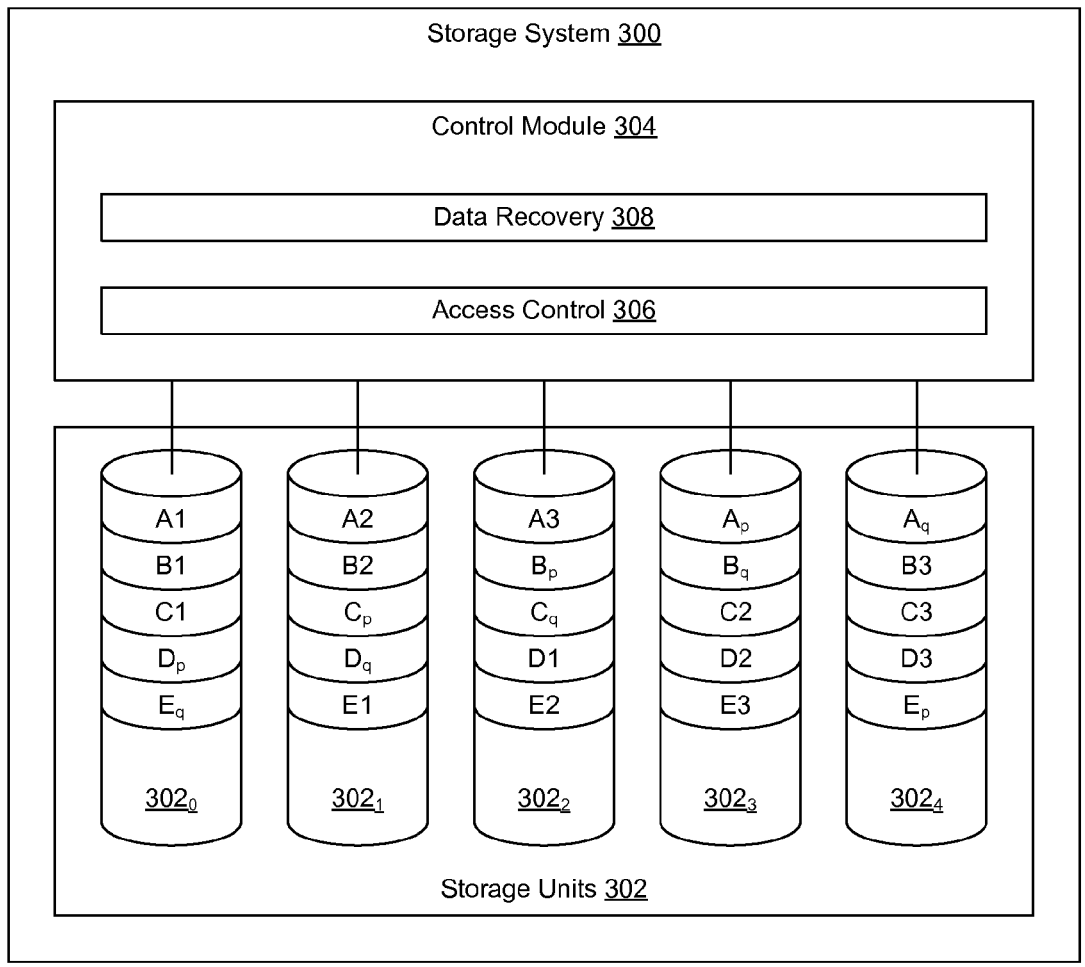
FIG. 3 is a block diagram of a storage system that includes a control module to distribute or stripe data across multiple storage units at a block or byte-level, and to compute erasure code syndromes as described with respect to FIG. 1.

FIG. 3 is a block diagram of a storage system 300 that includes storage units $302_0$ through $302_4$ (i.e., k=5), and a control module 304.

In FIG. 3, control module 304 is configured to distribute (e.g., stripe) data across storage units 302 at a block or byte-level, and to compute and distribute two parity blocks across storage units 302. Blocks denoted with an "A" are associated with a first stripe, where $A_1$, $A_2$, and $A_3$ represent data blocks, and $A_p$ and $A_q$ represent associated parity blocks. In this example, blocks denoted with an "A" are distributed or striped over k=5 storage units 302. Blocks denoted with B, D, D, and E, are associated with respective stripes.

Control module 304 includes an access control module 306 and a data recovery module 308, which may be configured as described herein with respect to access control module 106 data recovery module 108, respectively, in FIG. 1.

In FIG. 1, encoder 110 may be configured to compute error codes (e.g., erasure code syndromes), based on Reed Solomon (RS) operations using a Galois field (GF) polynomial, examples of which are provided below with respect to GF(256) using an 8-bit GF polynomial 0x11D, where "0x" denotes that "11D" is in hexadecimal form. A polynomial 0x11D may be expressed as 100011101 in binary, and as:

$$x^8+x^4+x^3+x^2+1. \tag{EQ. (1)}$$

Reed-Solomon (RS) codes are non-binary cyclic error-correcting codes, developed by Irving S. Reed and Gustave Solomon, to detect and correct multiple random symbol errors. By adding t check symbols to a set or stream of data, an RS code may detect any combination of up to t erroneous symbols, or up to $\lfloor t/2 \rfloor$ symbols. As an erasure code, RS may correct up to t known erasures. An RS code may also detect and correct combinations of errors and erasures. RS codes are suitable as multiple-burst bit-error correcting codes. The value of t may be selected within a relatively wide range.

In RS coding, source symbols are treated as coefficients of a polynomial p(x) over a finite field. Originally, this was to create n code symbols from k source symbols by oversampling p(x) at n>k distinct points, transmit the sampled points, and use interpolation techniques at a receiver to recover the original data. Conventionally, RS codes are treated as cyclic BCH codes, where encoding symbols are derived from the coefficients of a polynomial constructed by multiplying p(x) with a cyclic generator polynomial. This is may be utilized to provide relatively efficient decoding algorithms.

BCH codes form a class of cyclic error-correcting codes constructed using finite fields, independently developed by Alexis Hocquenghem in 1959 and by Raj Bose and D. K. Ray-Chaudhuriform in 1960. The acronym BCH is based on their initials (Bose-Chaudhuriform-Hocquenghem).

A feature of BCH codes is that during code design, there is control over the number of symbol errors correctable by the code. Specifically, binary BCH codes may be constructed to correct multiple bit errors. Another feature of BCH codes is relative ease of decoding based on an algebraic method referred to as syndrome decoding, which may be computed with relatively simple hardware and/or with relatively little processing time/resources.

To compensate for failure of any two storage units 102 in FIG. 1, two syndromes may computed, denoted here as P and Q. As described below, P may be computed as a parity or XOR of the data across the stripes, which may be computationally inexpensive. Q is an independent and more complicated syndrome, which may be computed with the assistance of field theory. Although Q may be generated using powers of another coefficient, x may be selected as the coefficient due to a technique to process such computations relative fast on general-purpose processors.

In abstract algebra, a finite field or Galois field is a field that contains a finite number of elements. The finite fields are classified by size. Specifically, there is exactly one finite field up to isomorphism of size $p^k$ for each prime p and positive integer k. Each finite field of size q is the splitting field of the polynomial $x^q - x$, and thus the fixed field of the Frobenius endomorphism which takes x to $x^q$. Similarly, the multiplicative group of the field is a cyclic group. Wedderburn's little theorem states that the Brauer group of a finite field is trivial, so that every finite division ring is a finite field.

A Galois field GF(q) may be defined for $q=2^n$, where:

$$GF(q) \cong F_2[x]/(p(x)),\qquad \text{EQ. (2)}$$

for an irreducible polynomial p(x) of degree n.

A portion or chunk of data may be written as:

$$d_{n-1}d_{n-2}\ldots d_0,\qquad \text{EQ. (3)}$$

in base 2 where each $d_i$ is 0 or 1. This is chosen to correspond with the element:

$$d_{n-1}x^{n-1}+d_{n-2}x^{n-2}+\ldots+d_1x+d_0\qquad \text{EQ. (4)}$$

in the Galois field.
Let:

$$D_0,\ldots,D_{k-1} \in GF(q),\qquad \text{EQ. (5)}$$

correspond to stripes of data across storage units (such as illustrated in FIG. 3), encoded as field elements in this manner or byte-sized chunks of the data. Denoting g as some generator of the field, $\oplus$ as addition in the field, concatenation as multiplication, and k as the number of storage units, P and Q may be computed as:

$$P = \bigoplus_i D_i = D_0 \oplus D_1 \oplus D_2 \oplus \ldots \oplus D_{k-1} \qquad \text{EQ. (6)}$$

$$Q = \bigoplus_i g_i D_i = g^0 D_0 \oplus g^1 D_1 \oplus \bigoplus g^2 D_2 \oplus \ldots \oplus g^{k-1} D_{k-1} \qquad \text{EQ. (7)}$$

In a computer system and/or logic $\oplus$ may represent a bitwise XOR operation $g^i$ may represent a linear feedback shift register operation on a chunk of data.

In accordance with EQ. (6), P may be computed as the XOR of each stripe. This is because addition in any characteristic two finite fields reduces to the XOR operation. In accordance with EQ. (7), Q may be computed as the XOR of a shifted version of each stripe.

Mathematically, the generator is an element of the field such that $g^i$ is different for each nonnegative i, for i<k.

If one data drive fails, data from the failed drive may be recovered from P. If two data drives fail, data from the two failed drives may be recovered from P and Q. If a data drive and the drive containing P are lost, data may be recovered from Q, using a more complex process.

As an example, suppose that values $D_i$ and $D_j$ are lost, with i≠j. Using other values of D, constants A and B may be found so that $D_i \oplus D_j = A$ and $g^i D_i \oplus g^j D_j = B$:

$$A = \bigoplus_{l: l \neq i \text{ and } l \neq j} D_l = P \oplus D_0 \oplus D_1 \oplus \ldots \oplus \qquad \text{EQ. (8)}$$
$$D_{i-1} \oplus D_{i+1} \oplus \ldots \oplus D_{j-1} \oplus D_{j+1} \oplus \ldots \oplus D_{k-1}$$

$$B = \bigoplus_{l: l \neq i \text{ and } l \neq j} g^l D_l = Q \oplus g^0 D_0 \oplus g^1 D_1 \oplus \ldots \oplus g^{i-1} D_{i-1} \oplus \qquad \text{EQ. (9)}$$
$$g^{i+1} D_{i+1} \oplus \ldots \oplus g^{j-1} D_{j-1} \oplus g^{j+1} D_{j+1} \oplus \ldots \oplus g^{n-1} D_{k-1}$$

Multiplying both sides EQ. (9) by $g^{k-i}$, and adding to EQ. (8) yields:

$$(g^{k-1+j} \oplus 1) D_j = g^{k-1} B \oplus A, \qquad \text{EQ. (10)}$$

and thus a solution for $D_j$, which may be used to compute $D_i$.

More generally, for k data storage units 102 in FIG. 1, and m failure/redundant disks, m syndromes may be computed as:

$$\text{Syndrome 1: } P = D_0 \oplus D_1 \oplus D_2 \ldots \oplus D_{k-1} \qquad \text{EQ. (11)}$$

$$\text{Syndrome 2: } Q = D_0 \oplus xD_1 \oplus x^2 D_2 \ldots \oplus x^{k-1} D_{k-1} \qquad \text{EQ. (12)}$$

$$\vdots$$

$$\text{Syndrome } m: R = D_0 \oplus \alpha D_1 \oplus \alpha^2 D_2 \ldots \alpha^{k-1} D_{k-1} \qquad \text{EQ. (13)}$$

EQS. (11) through (13) may be solved as a Vandermonde Matrix to determine lost bytes D. In a Vandermonde matrix each row of an m×k matrix includes a unique or distinct coefficient α:

$$V = \begin{bmatrix} D_0 & D_1 & D_2 & \ldots & D_{k-1} \\ D_0 & xD_1 & x^2D_2 & \ldots & x^{k-1}D_{k-1} \\ \vdots & \vdots & \vdots & \vdots & \vdots \\ D_0 & \alpha D_1 & \alpha^2 D_2 & \ldots & \alpha^{k-1}D_{k-1} \end{bmatrix} \quad \text{EQ. (14)}$$

Arbitrary coefficients of EQ. (14) are computationally more expensive relative to the computation of Q (when x is selected as the coefficient), as described above. To provide erasure recovery for 3 disk failures (i.e., EC3), a third syndrome may be computed using $x^2$ as:

$$R = D_0 \oplus x^2 D_1 \oplus x^4 D_2 \ldots \oplus x^{2k-2} D_{k-1} \quad \text{EQ. (15)}$$

EQ. 15 involves computation $x(xD_i)$ and may thus utilize twice the number of computations needed to compute Q with x as the coefficient. Computation of syndromes for m>3 (i.e., for more than 3 disk failures), is progressively more expensive computationally when only positive exponent coefficients are used.

In FIG. 1, encoder 110 is configured to compute R using positive and negative powers of coefficients, in a fashion that is similar to the computation of Q described above. Whereas conventional computation of an inverse is relatively difficult and may appear, at best, as a general full multiply-reduce operation.

For EC3, coefficients may be selected as $\{1, x, x^{-1}\}$, as in EQS. (16), (17), and (18), which may be expressed as a Vandermonde Matrix as in EQ. (19):

$$\text{Syndrome 1: } P = D_0 \oplus D_1 \oplus D_2 \ldots \oplus D_{k-1} \quad \text{EQ. (16)}$$

$$\text{Syndrome 2: } Q = D_0 \oplus xD_1 \oplus x^2 D_2 \ldots \oplus x^{k-1} D_{k-1} \quad \text{EQ. (17)}$$

$$\text{Syndrome 3: } R = D_0 \oplus x^{-1} D_1 \oplus x^{-2} D_2 \ldots \oplus x^{-(k-1)} D_{k-1} \quad \text{EQ. (18)}$$

$$V = \begin{bmatrix} D_0 & D_1 & D_2 & \ldots & D_{k-1} \\ D_0 & xD_1 & x^2 D_2 & \ldots & x^{k-1} D_{k-1} \\ D_0 & x^{-1} D_1 & x^{-2} D_2 & \ldots & x^{-(k-1)} D_{k-1} \end{bmatrix} \quad \text{EQ. (19)}$$

For EC4, coefficients may be selected as $\{1, x, x^{-1}, x^2\}$, to provide the three syndromes as in EQS. (16), (17), (18), above and a fourth syndrome as in EQ. (20), below.

$$\text{Syndrome1}: P = D_0 \oplus D_1 \oplus D_2 \ldots \oplus D_{k-1} \quad \text{EQ. (16)}$$

$$\text{Syndrome2}: Q = D_0 \oplus xD_1 \oplus x^2 D_2 \ldots \oplus x^{k-1} D_{k-1} \quad \text{EQ. (17)}$$

$$\text{Syndrome3}: R_0 = D_0 \oplus x^{-1} D_1 \oplus x^{-2} D_2 \ldots \oplus x^{-(k-1)} D_{k-1} \quad \text{EQ. (18)}$$

$$\text{Syndrome4}: R_1 = D_0 \oplus x^2 D_1 \oplus x^4 D_2 \ldots \oplus x^{2(k-1)} D_{k-1} \quad \text{EQ. (20)}$$

Positive and negative powers of coefficients may be used for larger redundancies (i.e., m>4 or EC5+), as will be apparent to one skilled in the relevant art(s). As an example, coefficients for EC6 may be selected as $\{1, x, x^{-1}, x^2, x^{-2}, x^4\}$, where each row or syndrome is computed using powers of a corresponding one of the coefficients. This is illustrated below with the four syndromes of EQS. (16), (17), (18), and (20) above, and fifth and sixth syndromes of EQS. (21) and (22) below.

$$\text{Syndrome1}: P = D_0 \oplus D_1 \oplus D_2 \ldots \oplus D_{k-1} \quad \text{EQ. (16)}$$

$$\text{Syndrome2}: Q = D_0 \oplus xD_1 \oplus x^2 D_2 \ldots \oplus x^{k-1} D_{k-1} \quad \text{EQ. (17)}$$

$$\text{Syndrome3}: R_0 = D_0 \oplus x^{-1} D_1 \oplus x^{-2} D_2 \ldots \oplus x^{-(k-1)} D_{k-1} \quad \text{EQ. (18)}$$

$$\text{Syndrome4}: R_1 = D_0 \oplus x^2 D_1 \oplus x^4 D_2 \ldots \oplus x^{2(k-1)} D_{k-1} \quad \text{EQ. (20)}$$

$$\text{Syndrome5}: R_2 = D_0 \oplus x^{-2} D_1 \oplus x^{-4} D_2 \ldots \oplus x^{-2(k-1)} D_{k-1} \quad \text{EQ. (21)}$$

$$\text{Syndrome6}: R_3 = D_0 \oplus x^4 D_1 \oplus x^8 D_2 \ldots \oplus x^{4(k-1)} D_{k-1} \quad \text{EQ. (22)}$$

Techniques to compute syndromes having positive and negative coefficient exponents are described in examples below.

In an embodiment, encoder 110 is configured to compute syndromes with exponents factored out (i.e., to reduce powers of x to +1 or −1), which may reduce computational efforts. For example, encoder 110 may be configured to compute syndrome Q with exponents factored out of EQ. (17), as in EQ. (23):

$$Q = D_0 \oplus x[D_1 \oplus x[D_2 \ldots \oplus xD_{k-1} \ldots ]]. \quad \text{EQ. (23)}$$

For EC3, encoder 110 may be further configured to compute $R_0$ with exponents of factored out of EQ. (18), as in EQ. (24).

$$R_0 = D_0 \oplus x^{-1}[D_1 \oplus x^{-1}[D_2 \ldots \oplus x^{-1}D_{k-1} \ldots ]]. \quad \text{EQ. (24)}$$

As an example, for k=4 (i.e., four storage units 102 in FIG. 1), EQS. (23) and (24) may be written as EQS. (25) and (26), respectively:

$$Q = D_0 \oplus x[D_1 \oplus x[D_2 \oplus xD_3]]. \quad \text{EQ. (25)}$$

$$R_0 = D_0 \oplus x^{-1}[D_1 \oplus x^{-1}[D_2 \oplus x^{-1}D_3]]. \quad \text{EQ. (26)}$$

For EC4+ (i.e., m>3), exponents may be factored out of equations for additional corresponding syndromes (e.g., EQS. (20), (21), and/or (22)), in a similar fashion.

When exponents are factored out of syndromes, such as described above, encoder 110 may be configured to compute xD and $x^{-1}D$ with left-shift operations and right-shift operations, respectively. Factoring exponents out of the syndromes, in combination with computing xD and/or $x^{-1}D$ with shift operations may be computationally less expensive relative to techniques that use only positive exponent coefficients.

Examples are provided below with respect to 8-bit polynomials 0x11D, in which bit positions of D are denoted D[0] through D[7], and in which D represents a byte or block of data. Methods and systems disclosed herein are not, however, limited to 8-bit polynomials 0x11D.

Computation of xD with a left-shift operation is described below with reference to FIG. 4.

Figure 4:
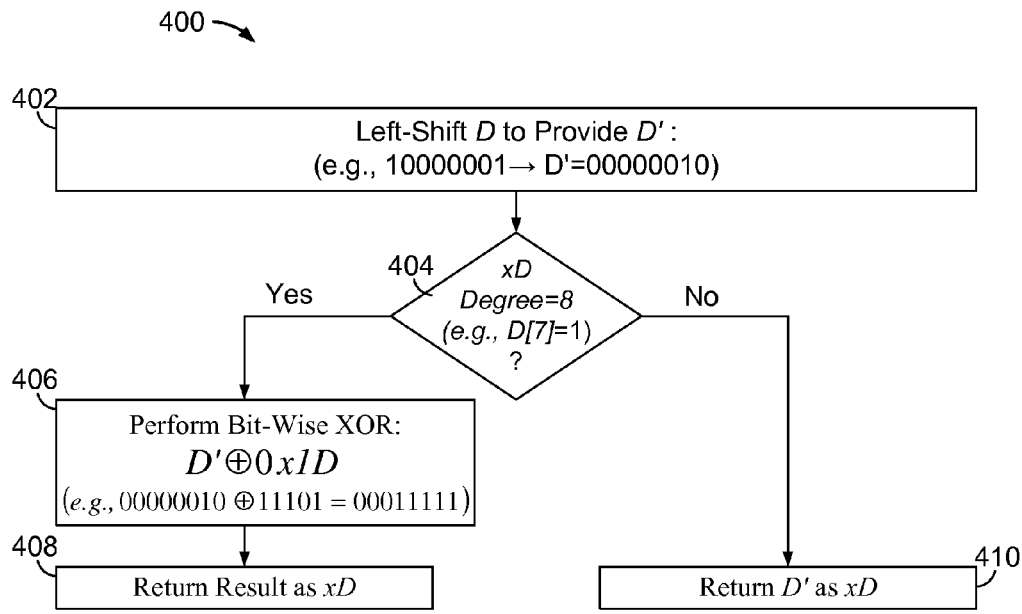
FIG. 4 is a flowchart of a method of computing a product of a data byte D and a positive coefficient exponent (i.e., xD) of a syndrome in a Galois field.

FIG. 4 is a flowchart of a method 400 of computing xD for a polynomial 0x11D in accordance with:

$$xD = (D<<1) \oplus (D[7]?0x1D:0). \quad \text{EQ. (27)}$$

EQ. (27) may be read as: compute xD as $(D<<1) \oplus (0x1D)$ or as $(D<<1) \oplus (0)$, depending upon the value of D[7], where "<<" represents a left-shift of $D_i$.

FIG. 4 is described below with respect to an example in which:

$$D = (x^7 + 1), \quad \text{EQ. (28)}$$

which may be represented as 10000001 in binary.

At 402 in FIG. 4, D=10000001 is shifted left one bit, which corresponds to binary multiplication of xD. This corresponds to $(D<<1)$.

Where D is a polynomial of degree 7 (i.e., D[7]=1), as in the example of EQ. (28), multiplication of $xD_i$ provides a polynomial of degree 8. In an 8-bit left-shift operation, however, the most significant bit (MSB) of D (i.e., D[7]) is shifted out and discarded. For the example of EQ. (28), a left-shift of 10000001 discards D[7]=1 to provide D'=00000010.

To detect a situation in which D[7]=1, a test is performed at 404. The test may compare D[7] to 1 or 0. In EQ. (27), this is represented as "D[7]?".

If D[7]=1, as in the example of EQ. (28), processing proceeds to 406 to account for the discarded MSB, D[7].

At 406, a reduction factor 0x1D is applied to D' in the form of a bit-wise XOR. In EQ. (27), this is represented as (D<<1)⊕(0x1D). Derivation of the reduction factor 0x1D is provided below.

For a polynomial 0x11D, the reduction factor is derived from EQ. (1) above as:

$$x^8 = x^4 + x^3 + x^2 + 1, \quad \text{EQ. (29)}$$

which may be represented as 00011101 in binary, and as 1D in hexadecimal (i.e., 0x1D).

Mathematically, the reduction factor of EQ. (29) may be substituted into EQ. (28) to provide:

$$xD_i = x(x^7+1) = x^8 + x = (x^4+x^3+x^2+1) + x = x^4+x^3+x^2+x+1, \quad \text{EQ. (30)}$$

which may be represented as 00011111 in binary, and as 1F in hexadecimal (i.e., 0x1F).

In FIG. 4, for the example of EQ. (28), the XOR operation at 406 provides:

$$00000010 \oplus 00011101 = 00011111, \quad \text{EQ. (31)}$$

which may be represented as:

$$x^4 + x^3 + x^2 + x + 1, \quad \text{EQ. (32)}$$

which corresponds to the mathematical result of EQ. (30).

At 408, the result of the XOR operation at 406 is returned as xD.

In another example:

$$D = (x^5 + 1), \quad \text{EQ. (33)}$$

which may be represented as 00100001 in binary.

Mathematically:

$$xD = x(x^5 + 1) = x^6 + x, \quad \text{EQ. (34)}$$

which is a polynomial of degree>8, and thus may be represented in binary with 8 bits (i.e., as 01000001), without reduction.

Computation of $xD = x(x^5+1)$ in accordance with FIG. 4 and EQ. (27), is described below.

At 402, the binary representation of $D=(x^5+1)=00100001$ is shifted left one bit without retaining the MSB to provide D'=01000010, which corresponds to the mathematical result of EQ. (34).

At 404, the MSB of D is tested. For the example of EQ. (33), the MSB (i.e., D[7]) is 0, and processing proceeds to 410, where D'=01000010 is returned as xD. This corresponds to (D<<1)⊕(0).

Computation of $x^{-1}D$ with a right-shift operation is described below with reference to FIG. 5 and EQ. (35).

Figure 5:
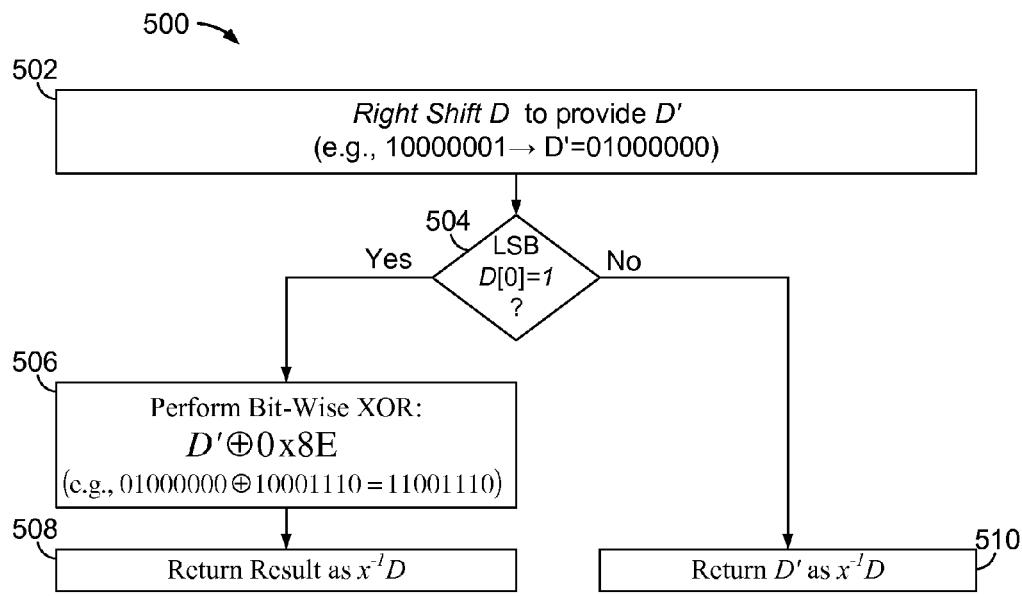
FIG. 5 is a flowchart of a method of computing a product of a data byte D and a negative coefficient exponent (i.e., $x^{-1}D$) of a syndrome in the Galois field.

FIG. 5 is a flowchart of a method 500 of computing $x^{-1}D$ for a polynomial 0x11D in accordance with:

$$x^{-1}D = (D>>1) \oplus (D[0]?0x8E:0) //0x8E==(0x11D>>1). \quad \text{EQ. (35)}$$

EQ. (35) may be read as: compute $x^{-1}D$ as (D>>1)⊕(0x8E) or as (D>>1)⊕(0), depending upon the value of D[0], where ">>" represents a right-shift of D.

FIG. 5 is described below with respect to the example of EQ. (28) in which D=10000001.

At 502, D=10000001 is shifted right one bit to provide $x^{-1}D$ (i.e., to divide D by x). This is represented in EQ. (35) as (D>>1).

In a right-shift operation, the least significant bit (LSB) of D (i.e., D[0]) is discarded. For the example of EQ. (28), a right-shift of 10000001 discards D[0]=1 to provide D'=01000000.

To detect a situation in which D[0]=1, a test is performed at 504. The test may compare D[0] to 1 or 0. In EQ. (35), this is represented as "D[0]?".

If D[0]=1, as in the example of EQ. (28), processing proceeds to 506 to account for the discarded LSB, D[0].

At 506, a compensation factor 0x8E is applied to D' in the form of a bit-wise XOR. In EQ. (35), this represented as (D>>1)⊕(0x8E). Derivation of the compensation factor 0x8E is provided below.

For a polynomial 0x11D:

$$x^8 = 0x1D. \quad \text{EQ. (36)}$$

By definition, (0x1D)=(0x1C)+1. Thus, $$1 = x^8 + (0x1C), \quad \text{EQ. (37)}$$

which may be represented as:

$$100000000 + 000011100 = 100011100 = 0x11C, \quad \text{EQ. (38)}$$

a right shift of which provides:

$$100011100 >> 010001110 = 0x8E, \quad \text{EQ. (39)}$$

which is the reduction factor of EQ. (35). In EQ. (35), this is reflected in the comment: //0x8E==(0x11D>>1).

For the example of EQ. (28), the XOR operation at 506 provides:

$$01000000 \oplus 10001110 = 11001110, \quad \text{EQ. (40)}$$

which may be represented as:

$$x^7 + x^6 + x^3 + x^2 + x. \quad \text{EQ. (41)}$$

At 508, the result of the XOR operation at 506 is returned as $x^{-1}D$.

In a situation where D[0]=0, D is divisible by x (i.e., D is not a polynomial in the form of . . . +1), processing proceeds from 404 to 410, where D' is returned as $x^{-1}D$. This corresponds to (D>>1)⊕(0).

In FIG. 5 and EQ. (35), properties of the Vandermonde matrix remain true because a finite Galois field is involved, and the inverse power of a coefficients (e.g., $x^{-1}$) thus exists and is distinct from other coefficients due to a relatively large order of a group (e.g., 255 for 8-bit Galois fields).

Figure 6:
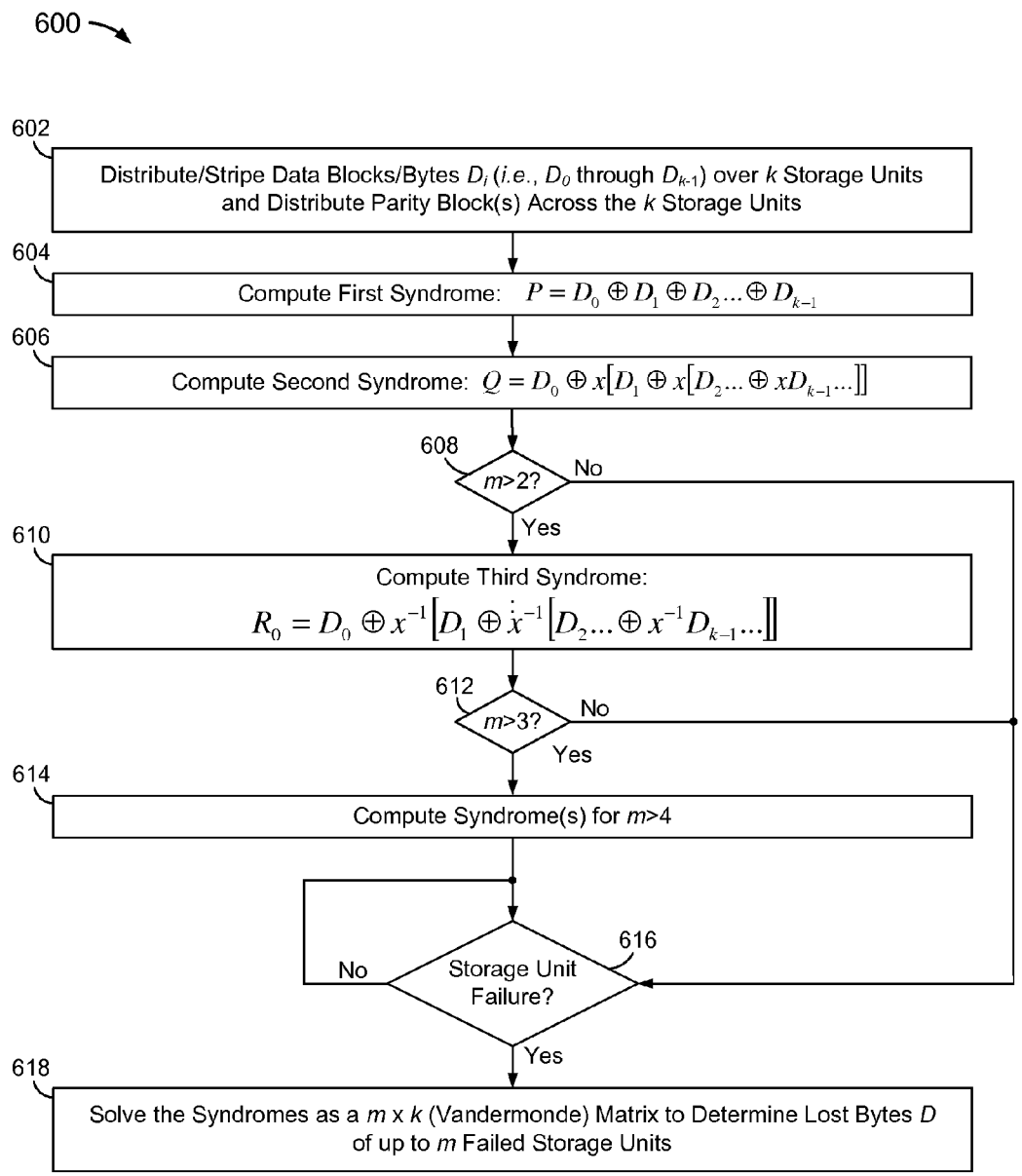
FIG. 6 is a flowchart of a method of computing and solving erasure code syndromes.

FIG. 6 is a flowchart of a method of computing erasure code syndromes to permit recovery of data from up to m failed storage units, for m>2.

At 602, data is distributed over k storage units with byte or block-level striping, and two parity blocks are computed and distributed over the k storage units.

At 604, syndrome P is computed in accordance with EQ. (16).

At 606, syndrome Q is computed in accordance with EQ. (23).

At 608, if data is to be recovered from more than 2 failed storage units (i.e., if m>2), processing proceeds to 610. Otherwise, processing proceeds to 618.

At 610, syndrome $R_0$ is computed in accordance with EQ. (24).

At 612, if data is to be recovered from more than 3 failed storage units (i.e., if m>3), processing proceeds to 616. Otherwise, processing proceeds to 620.

At 614, one or more additional syndromes are computed for each m over 3, such as described above with reference to EQS. 20, 21, and 22 with respect to m=4, 5, and 6 (i.e., based on coefficients $x^2$, and $x^{-2}$, and $x^4$, respectively).

At 616, upon a failure of up to m storage units, processing proceeds to 618.

At 618, the syndromes computed at 606 through 616 are solved as an m×k (Vandermonde) matrix to reconstruct data of the failed storage devices.

In FIG. 1, access control module 106 may be configured to distribute data as described with respect to 602 in FIG. 6, encoder 110 may be configured to compute syndromes as described with respect to 604 through 614 in FIG. 6, and data reconstruction module 112 may be configured to solve the syndromes as described above with respect to 618 in FIG. 6.

Figure 7:
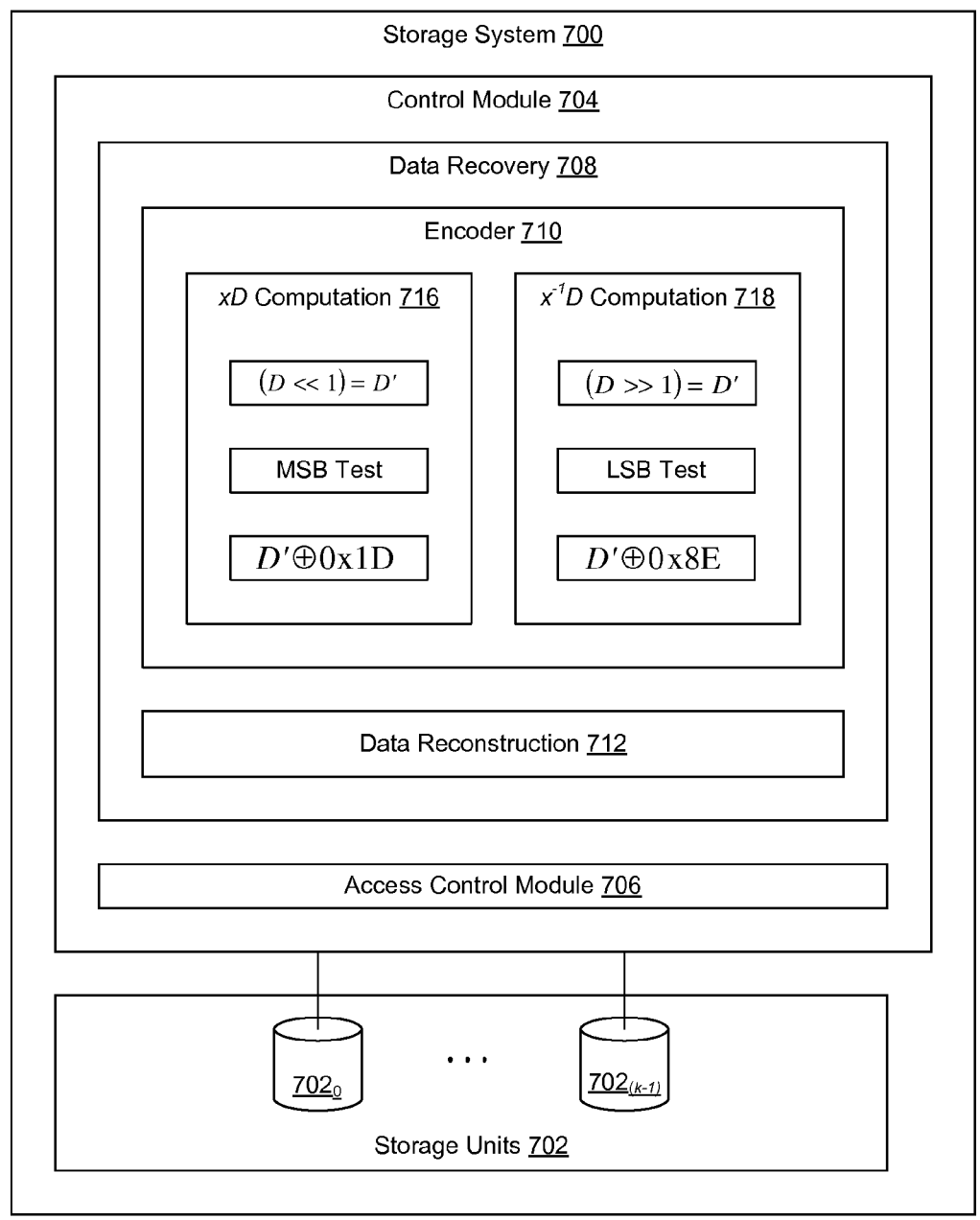
FIG. 7 is a block diagram of a storage system that includes an erasure code module to compute xD and $x^{-1}D$ for a Galois field with respective left and right-shifts, and selective compensation.

FIG. 7 is a block diagram of a storage system 700 that includes k storage units 702 and a control module 704. Control module 704 includes an access control module 706 to manage storage units 702, including to present storage units 702 as a single logical device to one or more other systems, such as described in one or more examples herein. Access control module 704 may be configured to distribute (e.g., stripe) blocks of data (e.g., bytes) across storage units 702, and to compute and store one or more parity blocks within one or more storage units 702. As an example, and without limitation, module 712 may be configured to distribute data and two parity blocks across storage units 702, such as described above with reference to FIG. 3.

Control module 704 further includes a data recovery module 706, illustrated here as including an encoder 710 to compute m erasure code syndromes that include positive and negative coefficient exponents, to permit reconstruction/recovery of data of up to m failed storage units 702, such as described in one or more examples herein. Data recovery module 706 further includes a data reconstruction module 712 to reconstruct data based on the erasure code syndromes and data of remaining (i.e., non-failed) storage units 702.

In the example of FIG. 7, encoder 710 includes product computation modules 716 and 718 to compute xD and $x^{-1}$D, respectively, such as described in one or more examples herein.

One or more features disclosed herein may be implemented with/as circuitry, a machine, a computer system, a processor and memory, a computer program encoded within a computer-readable medium, and/or combinations thereof. Circuitry may include discrete and/or integrated circuitry, application specific integrated circuitry (ASIC), a system-on-a-chip (SOC), and combinations thereof. Information processing by software may be concretely realized by using hardware resources.

Figure 8:
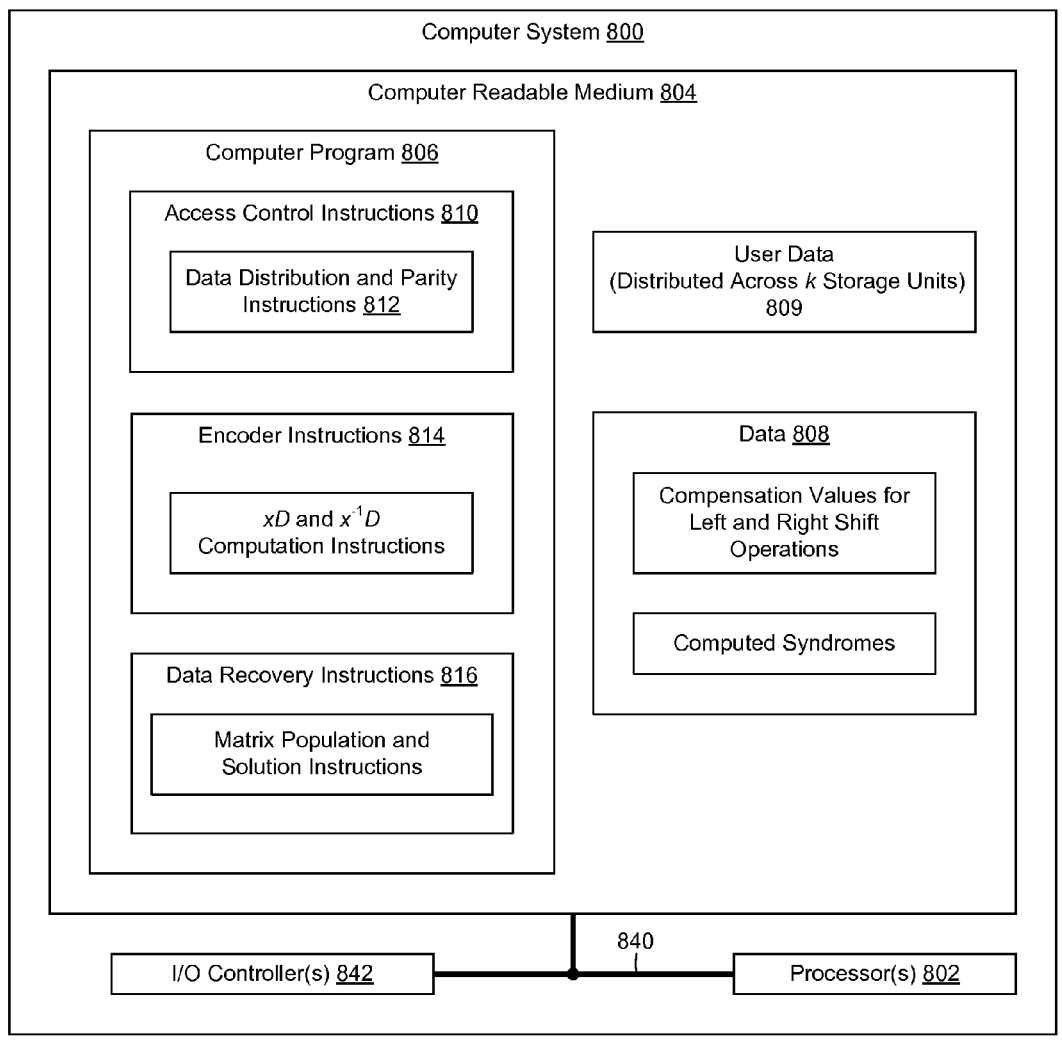
FIG. 8 is a block diagram of a computer system configured to compute erasure code syndromes based on data stored across multiple storage devices, and to solve the erasure code syndromes to reconstruct data of failed storage units.

FIG. 8 is a block diagram of a computer system 800 configured to manage a set of k storage units, including to distribute data over the k storage units, present the k storage units as a single logical device to one or more other systems, and reconstruct data of up to m of the k storage units.

Computer system 800 includes one or more processors and/or processor cores, illustrated here as a processor 802, and a computer readable medium 804.

Processor 802 may include and/or be configured as, without limitation, a microprocessor, a graphics processor, a physics processor, a digital signal processor, a network processor, a front-end communications processor, a co-processor, a management engine (ME), a controller or microcontroller, a central processing unit (CPU), a general purpose instruction processor, and/or an application-specific processor (e.g., a dedicated controller of a storage system).

Processor 802 may include a control unit to interface with computer readable medium 804.

Computer readable medium 804 may include a transitory or non-transitory computer-readable medium, examples of which are provided below with reference to FIG. 9. Computer-readable medium 804 is not, however, limited to the examples of FIG. 9.

Figure 9:
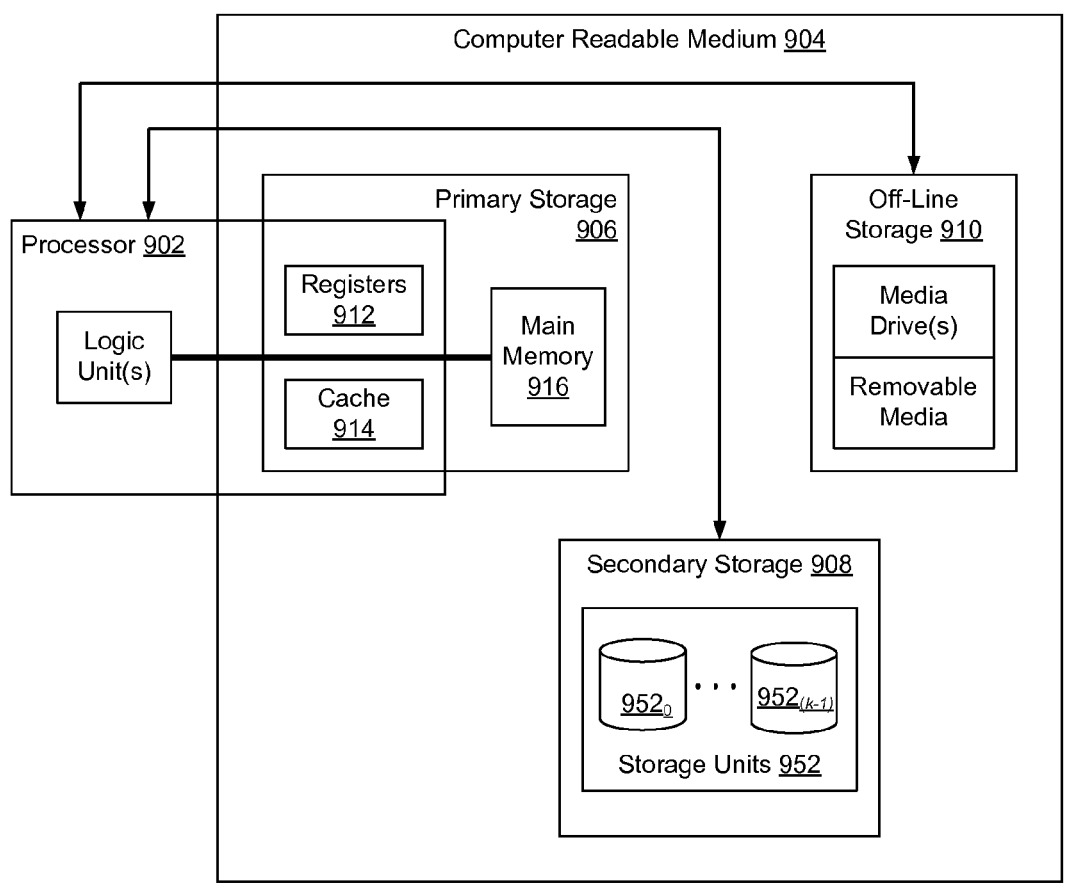
FIG. 9 is a block diagram of a processor and a computer readable medium that includes multiple storage units.

FIG. 9 is a block diagram of a processor 902 and a computer readable medium 904. In FIG. 9, computer readable medium 904 includes primary storage 906, secondary storage 908, and off-line storage 910.

Primary storage 906 includes registers 912, processor cache 914, and main memory or system memory 916. Registers 912 and cache 914 may be directly accessible by processor 902. Main memory 916 may be accessible to processor 902 directly and/or indirectly through a memory bus. Primary storage 906 may include volatile memory such as random-access memory (RAM) and variations thereof including, without limitation, static RAM (SRAM) and/or dynamic RAM (DRAM).

Secondary storage 908 may be indirectly accessible to processor 902 through an input/output (I/O) channel, and may include non-volatile memory such as read-only memory (ROM) and variations thereof including, without limitation, programmable ROM (PROM), erasable PROM (EPROM), and electrically erasable PROM (EEPROM). Non-volatile memory may also include non-volatile RAM (NVRAM) such as flash memory. Secondary storage 908 may be configured as a mass storage device, such as a hard disk or hard drive, a flash memory drive, stick, or key, a floppy disk, a zip drive, and/or firmware.

In the example of FIG. 9, secondary storage 908 includes k storage units 952, which may be configured as described in one or more examples herein.

Off-line storage 910 may include a physical device driver and an associated removable storage medium, such as an optical disc.

In FIG. 8, computer readable medium 804 includes a computer program 806 encoded therein, that includes instructions to cause processor 802 to manage storage units 952 as described in one or more examples herein.

Computer readable medium 804 further includes data 808 to be used by processor 802 during execution of computer program 806 and/or generated by processor 802 during execution of computer program 806.

Computer readable medium 804 further includes user data 809, which is distributed (e.g., striped) across storage units 952.

In the example of FIG. 8, computer program 806 includes access control instructions 810 to cause processor 802 to present storage units 952 as a single logical unit. Access control instructions 810 may include data distribution and/or parity instructions to cause processor 802 to distribute user data 809 across storage units 952, and/or to compute and store one or more parity blocks within one or more storage units 952, such as described in one or more examples herein.

Computer program 806 further includes encoder instructions 814 to cause processor 802 to compute m erasure code syndromes to permit reconstruction of data from up to m failed storage units 952, such as described in one or more examples herein.

Computer program 806 further includes data recovery instructions 816 to cause processor 802 to reconstruct data of up to m failed storage units 952 based on the syndromes and data in remaining storage units 952.

Computer program 806 may be configured as an application program, as part of an operating system, and/or as part of a virtual machine manager. Computer program 806 is not, however, limited to these examples.

Computer system 800 further includes communications infrastructure 840 to communicate amongst devices and/or resources of computer system 800.

Computer program 806 may be configured to present storage units 952 as a single logical device to one or more other computer programs that are configured to execute on processor 802 (e.g., application program(s), operating system(s), virtual machine(s), and/or a virtual machine manager (VMM)).

Computer system 800 may include one or more input/output (I/O) devices and/or I/O controllers 842 to interface with one or more other systems, such as to permit other devices to access storage units 952 as a single logical device.

Processor 802 and a portion of computer readable medium 804 that includes computer program 806 and data 808, may represent an example embodiment of a control module as described in one or more examples herein.

A processor and memory, such as described above with respect to FIGS. 8 and 9, may be configured to compute syndromes on a byte or block level with Single Instruction Multiple Data (SIMD) and/or SIMD extensions, such as streaming SIMD extensions (SSE) and/or advanced vector extensions (AVX), developed by Intel Corporation of Santa Clara, Calif., and collectively referred to herein as IA SEE/AVX instructions. The tests or comparison operations (e.g., at 404 in FIG. 4 and/or at 504 in FIG. 5), may be performed with a PCMPGTB instruction that generates a mask to conditionally XOR a polynomial, developed by Intel Corporation. EC modules are not, however, limited to a processor and memory, SIMD instructions, and/or a PCMPGTB instruction.

Methods and systems disclosed herein may be implemented with respect to one or more of a variety of systems, such as described below with reference to FIG. 10. Methods and systems disclosed herein are not, however, limited to the examples of FIG. 10.

Figure 10:
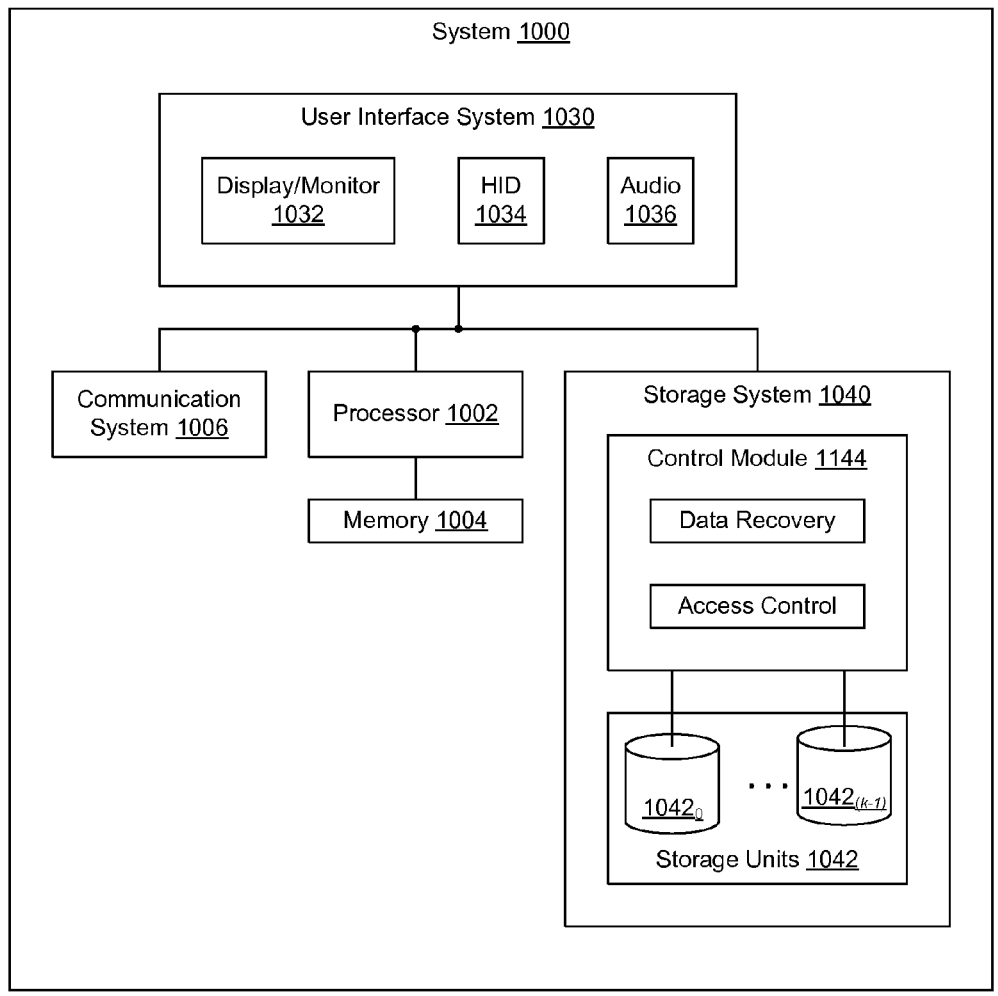
FIG. 10 is a block diagram of a system that includes a processor and memory, and a storage system that includes multiple storage units.

FIG. 10 is a block diagram of a system 1000, including a processor 1002 and memory 1004, which may include system memory, cache, and/or registers. System 1000 further includes a communication system 1006 and a user interface system 1030.

System 1000 further includes a storage system 1040 that includes k storage units 1042 and a control module 1144. Storage system 1040 may be configured as described in one or more examples herein.

Communication system 1006 may include a wired and/or wireless communication system. Communication system 1006 may be configured to communicate between an external communication network and processor 1002, user interface system 1030, and/or storage system 1040. The external network may include a voice network (e.g., a wireless telephone network), and/or a data or packet-based network (e.g., a proprietary network and/or the Internet).

User interface system 1030 may include a monitor or display 1032 and/or a human interface device (HID) 1034. HID 1034 may include, without limitation, a key board, a cursor device, a touch-sensitive device, a motion and/or image sensor, a physical device and/or a virtual device, such as a monitor-displayed virtual keyboard. User interface system 1030 may include an audio system 1036, which may include a microphone and/or a speaker.

System 1600 may be configured as a stationary or portable/hand-held system, and may be configured as, for example, a mobile telephone, a set-top box, a gaming device, and/or a rack-mountable, desk-top, lap-top, note-book, net-book, note-pad, or tablet system, and/or other conventional and/or future-developed system(s). System 1600 is not, however, limited to these examples.

EXAMPLES

The following examples pertain to further embodiments.

An Example 1 is a method of reconstructing data distributed over multiple storage units, comprising: computing m erasure code syndromes based on Reed Solomon (RS) operations in a Galois field and the data distributed over the k storage units; and reconstructing data of up to m of the k storage units based on the data stored in remaining ones of the k storage units, where k and m are positive integers and m is greater than 2.

In an Example 2, the computing of Example 1 includes computing, in the Galois field, a product of a data byte and a syndrome coefficient $x^{-1}$ as a right-shift of the data byte, and selectively compensating a result of the right-shift based on a value of a least significant bit of the data byte.

In an Example 2, the selectively compensating of Example 2 includes selectively compensating the result of the right-shift with a constant derived from an irreducible polynomial associated with the Galois field.

In an Example 4, the computing of Example 3 further includes computing the syndromes based on a $2^8$ Galois field, including computing the product of the data byte and the coefficient $x^{-1}$ as an 8-bit right-shift of the data byte, and selectively bit-wise XORing the result of the right-shift with a constant derived from an irreducible polynomial associated with the $2^8$ Galois field.

In an Example 5, the computing of Example 4 further includes computing the syndromes based on an 8-bit Galois field polynomial 0x11D, and selectively bit-wise XORing the result of the right-shift with hexadecimal value 8E.

In an Example 6, the computing of Example 1 includes computing, in the Galois field, a product of a data byte and a coefficient x as a left-shift of the data byte, and selectively compensating a result of the left-shift based on a value of a most significant bit of the data byte.

In an Example 7, the selectively compensating of Example 6 includes selectively compensating the result of the left-shift with a constant derived from an irreducible polynomial associated with the Galois field.

In an Example 8, the computing of Example 7 further includes computing the syndromes based on a $2^8$ Galois field, including computing the product of the data byte and the coefficient x as an 8-bit left-shift of the data byte and selectively bit-wise XORing the result of the left-shift with a constant derived from an irreducible polynomial associated with the $2^8$ Galois field.

In an Example 9, the computing of Example 8 further includes computing the syndromes based on an 8-bit Galois field polynomial 0x11D, and selectively bit-wise XORing the result of the left-shift with hexadecimal value 1D.

In an Example 10, the computing of any one of Examples 1-9 includes computing syndromes for m greater than 2 with coefficient exponents that consist of integer values −1, 0, and 1.

In an Example 11, the computing of Example 10 further includes computing a syndrome as $D_0 \oplus x^{-1}[D_1 \oplus x^{-1}[D_2 \ldots \oplus x^{-1}D_{k-1} \ldots ]]$, including computing $x^{-1}D$ for one or more of data bytes of $D_1$ through $D_{k-1}$ as a right-shift of the data byte and selectively compensating the result of the right-shift based on value of the least significant bit of the respective data byte.

In an Example 12, the computing of Example 10 further includes computing a syndrome as $D_0 \oplus x[D_1 \oplus x$

[$D_2 \ldots \oplus xD_{k-1}$]], including computing xD for one or more of data bytes of $D_1$ through $D_{k-1}$ as a left-shift of the data byte and selectively compensating the result of the left-shift based on a value of the most significant bit of the respective data byte.

In an Example 13, the computing of any one of Examples 1-9 includes computing syndromes for m greater than 2 with coefficient exponents that include integer values −1, 0, and 1, and one or more other integer values.

In an Example 14, the reconstructing of any one of Examples 1-9 includes populating an m×k matrix with coefficients of the m syndromes as a Vandermonde matrix, and solving the Vandermonde matrix to reconstruct data of up to m of the k storage units.

In an Example 15, one of the k storage units of any one of Examples 1-9 includes a redundant array of l independent storage units, and the method further includes: computing n erasure code syndromes based on Reed Solomon (RS) operations in a Galois field and data distributed over the l storage units; and reconstructing data of up to n of the l storage units based on the n syndromes and data stored in remaining ones of the l storage units, where l and n are positive integers and n is greater than 2.

In an Example 16, m and n differ from one another.

In an Example 17, the computing of Example 15 further includes computing syndromes for n greater than 2 with coefficient exponents that consist of integer values −1, 0, and 1.

An Example 18 is an apparatus configured to perform the method of any one of Examples 1-16.

An Example 19 is an apparatus comprising means for performing the method of any one of Examples 1-16.

An Example 20 is a machine to perform the method of any one of Examples 1-16.

An Example 21 is a machine-readable medium that includes a plurality of instructions that, when executed on a computing device, cause the computing device to carry out a method according to any one of Examples 1-16.

An Example 22 is a communications device arranged to perform the method of any one of Examples 1-16.

An Example 23 is a computer system to perform the method of any one of Examples 1-16.

An Example 24 is a computing device that includes a chipset according to any one of Examples 1-16.

An Example 25 is an apparatus to reconstruct data distributed over multiple storage units, including: a first erasure code module to compute m erasure code syndromes based on Reed Solomon (RS) operations in a Galois field and the data distributed over k storage units; and a first data reconstruction module to reconstruct data of up to m of the k storage units based on the m syndromes and data stored in remaining ones of the k storage units, where k and m are positive integers, and m is greater than 2.

In an Example 26, the first erasure code module is configured to compute, in the Galois field, a product of a data byte and a syndrome coefficient $x^{-1}$ as a right-shift of the data byte and selectively compensate a result of the right-shift based on a value of a least significant bit of the data byte.

In an Example 27, the first erasure code module of Example 26 is further configured to selectively compensate the result of the right-shift with a constant derived from an irreducible polynomial associated with the Galois field.

In an Example 28, the first erasure code module of Example 27 is further configured to compute the syndromes based on a $2^8$ Galois field, including to compute the product of the data byte and the coefficient $x^{-1}$ as an 8-bit right-shift of the data byte and selectively bit-wise XOR the result of the right-shift with a constant derived from an irreducible polynomial associated with the $2^8$ Galois field.

In an Example 29, the first erasure code module of Example 28 is further configured to compute the syndromes based on an 8-bit Galois field polynomial 0x11D and selectively bit-wise XOR the result of the right-shift with hexadecimal value 8E.

In an Example 30, the first erasure code module of Example 25 is configured to compute, in the Galois field, a product of a data byte and a coefficient x as a left-shift of the data byte and selectively compensate a result of the left-shift based on a value of a most significant bit of the data byte.

In an Example 31, the first erasure code module of Example 30 is further configured to selectively compensate the result of the left-shift with a constant derived from an irreducible polynomial associated with the Galois field.

In an Example 32, the first erasure code module of Example 31 is further configured to compute the syndromes based on a $2^8$ Galois field, including to compute the product of the data byte and the coefficient x as an 8-bit left-shift of the data byte and selectively bit-wise XOR the result of the left-shift with a constant derived from an irreducible polynomial associated with the $2^8$ Galois field.

In an Example 33, the first erasure code module of Example 32 is further configured to compute the syndromes based on an 8-bit Galois field polynomial 0x11D and selectively bit-wise XOR the result of the left-shift with hexadecimal value 1D.

In an Example 34, the first erasure code module of any one of Examples 25-33 is configured to compute syndromes for m greater than 2 with coefficient exponents that consist of integer values −1, 0, and 1.

In an Example 35, the first erasure code module of Example 34 is further configured to compute a syndrome as $D_0 \oplus x^{-1}[D_1 \oplus x^{-1}[D_2 \ldots \oplus x^{-1}D_{k-1} \ldots ]]$, including to compute $x^{-1}D$ for one or more of data bytes of $D_1$ through $D_{k-1}$ as a right-shift of the data byte and selectively compensate the result of the right-shift based on value of the least significant bit of the respective data byte.

In an Example 36, the first erasure code module of Example 34 is further configured to compute a syndrome as $D_0 \oplus x[D_1 \oplus x[D_2 \ldots \oplus xD_{k-1} \ldots ]]$, including to compute xD for one or more of data bytes of $D_1$ through $D_{k-1}$ as a left-shift of the data byte and selectively compensate the result of the left-shift based on a value of the most significant bit of the respective data byte.

In an Example 37, the first erasure code module of any one of Examples 25-33 is configured to compute syndromes for m greater than 2 with coefficient exponents that include integer values −1, 0, and 1, and one or more other integer values.

In an Example 38, the first data reconstruction module of any one of Examples 25-33 is configured to populate an m×k matrix with coefficients of the m syndromes as a Vandermonde matrix, and to solve the Vandermonde matrix to reconstruct data of up to m of the k storage units.

In an Example 39, one of the k storage units of any one of Examples 25-33 includes a redundant array of l independent storage units, the apparatus further including:

a second erasure code module to compute n erasure code syndromes based on Reed Solomon (RS) operations in a Galois field and data distributed over the l storage units; and a second data reconstruction module to reconstruct data of up to n of the l storage units based on the n syndromes and data stored in remaining ones of the l storage units, where l and n are positive integers and n is greater than 2.

In an Example 40, m and n differ from one another.

In an Example 41, the second erasure code module of Example 39 is configured to compute syndromes for n greater than 2 with coefficient exponents that consist of integer values −1, 0, and 1.

An Example 42 is a non-transitory computer readable medium encoded with a computer program, including instructions to cause a processor to reconstruct data distributed over multiple storage units, including to: compute m erasure code syndromes based on Reed Solomon (RS) operations in a Galois field and the data distributed over k storage units; and reconstruct data of up to m of the k storage units based on the m syndromes and data stored in remaining ones of the k storage units, where k and m are positive integers and m is greater than 2.

In an Example 43, the computer readable medium of Example 42 further includes instructions to cause the processor to:

compute, in the Galois field, a product of a data byte and a syndrome coefficient $x^{-1}$ as a right-shift of the data byte; and selectively compensate a result of the right-shift based on a value of a least significant bit of the data byte.

In an Example 44, the computer readable medium of Example 43 further includes instructions to cause the processor to selectively compensate the result of the right-shift with a constant derived from an irreducible polynomial associated with the Galois field.

In an Example 45, the computer readable medium of Example 44 further includes instructions to cause the processor to compute the syndromes based on a $2^8$ Galois field, including to:

compute the product of the data byte and the coefficient $x^{-1}$ as an 8-bit right-shift of the data byte; and selectively bit-wise XOR the result of the right-shift with a constant derived from an irreducible polynomial associated with the $2^8$ Galois field.

In an Example 46, the computer readable medium of Example 45 further includes instructions to cause the processor to compute the syndromes based on an 8-bit Galois field polynomial 0x11D, and selectively bit-wise XOR the result of the right-shift with hexadecimal value 8E.

In an Example 47, the computer readable medium of Example 42 further includes instructions to cause the processor to: compute, in the Galois field, a product of a data byte and a coefficient x as a left-shift of the data byte; and selectively compensate a result of the left-shift based on a value of a most significant bit of the data byte.

In an Example 48, the computer readable medium of Example 47 further includes instructions to cause the processor to selectively compensate the result of the left-shift with a constant derived from an irreducible polynomial associated with the Galois field.

In an Example 49, the computer readable medium of Example 48 further includes instructions to cause the processor to compute the syndromes based on a $2^8$ Galois field, including to: compute the product of the data byte and the coefficient x as an 8-bit left-shift of the data byte; and selectively bit-wise XOR the result of the left-shift with a constant derived from an irreducible polynomial associated with the $2^8$ Galois field.

In an Example 50, the computer readable medium of Example 49 further includes instructions to cause the processor to compute the syndromes based on an 8-bit Galois field polynomial 0x11D, and selectively bit-wise XOR the result of the left-shift with hexadecimal value 1D.

In an Example 51, the computer readable medium of any one of Example 42-50 instructions to cause the processor to compute syndromes for m greater than 2 with coefficient exponents that consist of integer values −1, 0, and 1.

In an Example 52, the computer readable medium of Example 51 further includes instructions to cause the processor to:

compute a syndrome as $D_0 \oplus x^{-1}[D_1 \oplus x^{-1}[D_2 \ldots \oplus x^{-1} D_{k-1} \ldots ]]$, including to compute $x^{-1}D$ for one or more of data bytes of $D_1$ through $D_{k-1}$ as a right-shift of the data byte, and selectively compensate the result of the right-shift based on value of the least significant bit of the respective data byte.

In an Example 53, the computer readable medium of Example 51 further includes instructions to cause the processor to:

compute a syndrome as $D_0 \oplus x[D_1 \oplus x[D_2 \ldots \oplus x D_{k-1} \ldots ]]$, including to compute xD for one or more of data bytes of $D_1$ through $D_{k-1}$ as a left-shift of the data byte, and selectively compensate the result of the left-shift based on a value of the most significant bit of the respective data byte.

In an Example 54, the computer readable medium of any one of Examples 42-50 further includes instructions to cause the processor to compute syndromes for m greater than 2 with coefficient exponents that include integer values −1, 0, and 1, and one or more other integer values.

In an Example 55, the computer readable medium of any one of Examples 42-50 further includes instructions to cause the processor to populate an m×k matrix with coefficients of the m syndromes as a Vandermonde matrix, and to solve the Vandermonde matrix to reconstruct data of up to m of the k storage units.

In an Example 56, one of the k storage units of any one of Examples 42-50 includes a redundant array of l independent storage units, and the computer readable medium further includes instructions to cause the processor to: compute n erasure code syndromes based on Reed Solomon (RS) operations in a Galois field and data distributed over the l storage units; and reconstruct data of up to n of the l storage units based on the n syndromes and data stored in remaining ones of the l storage units, where l and n are positive integers and n is greater than 2.

In an Example 57, m and n of Example 56 differ from one another.

In an Example 58, the computer readable medium of Example 49 further includes instructions to cause the processor to compute syndromes for n greater than 2 with coefficient exponents that consist of integer values −1, 0, and 1.

An Example 59 is a system that includes: k storage units; and a processor and memory to distribute data over the k storage units, compute m erasure code syndromes based on Reed Solomon (RS) operations in a Galois field and the data distributed over the k storage units, and reconstruct data of up to m of the k storage units based on the m syndromes and data stored in remaining ones of the k storage units, where k and m are positive integers, and m is greater than 2.

In an Example 60, the processor and memory of Example 59 are configured to compute, in the Galois field, a product of a data byte and a syndrome coefficient $x^{-1}$ as a right-shift of the data byte, and to selectively compensate a result of the right-shift based on a value of a least significant bit of the data byte.

In an Example 61, the processor and memory of Example 60 are further configured to selectively compensate the result of the right-shift with a constant derived from an irreducible polynomial associated with the Galois field.

In an Example 62, the processor and memory of Example 61 are further configured to compute the syndromes based on a $2^8$ Galois field, including to compute the product of the data byte and the coefficient $x^{-1}$ as an 8-bit right-shift of the data byte, and to selectively bit-wise XOR the result of the right-shift with a constant derived from an irreducible polynomial associated with the $2^8$ Galois field.

In an Example 63, the processor and memory of Example 62 are further configured to compute the syndromes based on an 8-bit Galois field polynomial 0x11D, and to selectively bit-wise XOR the result of the right-shift with hexadecimal value 8E.

In an Example 64, the processor and memory of Example 59 are configured to compute, in the Galois field, a product of a data byte and a coefficient x as a left-shift of the data byte, and to selectively compensate a result of the left-shift based on a value of a most significant bit of the data byte.

In an Example 65, the processor and memory of Example 64 are further configured to selectively compensate the result of the left-shift with a constant derived from an irreducible polynomial associated with the Galois field.

In an Example 66, the processor and memory of Example 65 are further configured to compute the syndromes based on a $2^8$ Galois field, including to compute the product of the data byte and the coefficient x as an 8-bit left-shift of the data byte and selectively bit-wise XOR the result of the left-shift with a constant derived from an irreducible polynomial associated with the $2^8$ Galois field.

In an Example 67, the processor and memory of Example 66 are further configured to compute the syndromes based on an 8-bit Galois field polynomial 0x11D, and to selectively bit-wise XOR the result of the left-shift with hexadecimal value 1D.

In an Example 68, the processor and memory of any one of Examples 59-67 are further configured to compute syndromes for m greater than 2 with coefficient exponents that consist of integer values −1, 0, and 1.

In an Example 69, the processor and memory of Example 68 are further configured to compute a syndrome as $D_0 \oplus x^{-1}[D_1 \oplus x^{-1}[D_2 \ldots \oplus x^{-1}D_{k-1} \ldots ]]$, including to compute $x^{-1}D$ for one or more of data bytes of $D_1$ through $D_{k-1}$ as a right-shift of the data byte, and to selectively compensate the result of the right-shift based on value of the least significant bit of the respective data byte.

In an Example 70, the processor and memory of Example 68 are further configured to compute a syndrome as $D_0 \oplus x[D_1 \oplus x[D_2 \ldots \oplus xD_{k-1} \ldots ]]$, including to compute xD for one or more of data bytes of $D_1$ through $D_{k-1}$ as a left-shift of the data byte, and to selectively compensate the result of the left-shift based on a value of the most significant bit of the respective data byte.

In an Example 71, the processor and memory of any one of Examples 25-33 are further configured to compute syndromes for m greater than 2 with coefficient exponents that include integer values −1, 0, and 1, and one or more other integer values.

In an Example 72, the processor and memory any one of Examples 25-33 are further configured to populate an m×k matrix with coefficients of the m syndromes as a Vandermonde matrix, and to solve the Vandermonde matrix to reconstruct data of up to m of the k storage units.

In an Example 73, one of the k storage units of Example 59 includes l storage units, and the processor and memory are configured to: to distribute data over the l storage units; compute n erasure code syndromes based on Reed Solomon (RS) operations in a Galois field and data distributed over the l storage units; and reconstruct data of up to n of the l storage units based on the n syndromes and data stored in remaining ones of the l storage units, where l and n are positive integers and n is greater than 2.

In an Example 74, m and n of Example 73 differ from one another.

In an Example 75, the processor and memory of Example 73 are further configured to compute syndromes for n greater than 2 with coefficient exponents that consist of integer values −1, 0, and 1.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed. While various embodiments are disclosed herein, it should be understood that they are presented as examples. The scope of the claims should not be limited by any of the example embodiments disclosed herein.

What is claimed is:

1. An apparatus, comprising, a processor and memory configured to:
    compute m erasure code syndromes based on Reed Solomon (RS) operations in a Galois field and data distributed over k storage units, wherein at least one of the m erasure code syndromes includes a coefficient of exponent negative one ($x^{-1}$) and a coefficient of exponent positive one (x), including to compute, in the Galois field, one or more of,
        a product of a data byte and the coefficient $x^{-1}$ as a right-shift of the data byte, and
        a product of the data byte and the coefficient x as a left-shift of the data byte; and
    reconstruct data of up to m of the k storage units based on the m erasure code syndromes and data stored in remaining ones of the k storage units, where k and m are positive integers, wherein m is greater than 2, and wherein k is greater than m.

2. The apparatus of claim 1, wherein the processor and memory are further configured to:
    compute, in the Galois field, the product of the data byte and coefficient $x^{-1}$ as the right-shift of the data byte; and
    compensate a result of the right-shift if a least significant bit (LSB) of the data byte is a predetermined one of multiple logic states.

3. The apparatus of claim 2, wherein the processor and memory are further configured to:
    compensate the result of the right-shift with a constant derived from an irreducible polynomial associated with the Galois field, if the LSB of the data byte is the predetermined logic state.

4. The apparatus of claim 3, wherein the Galois field is a $2^8$ Galois field, and wherein the processor and memory are further configured to:
    perform the right shift as an 8-bit right-shift of the data byte; and
    bit-wise XOR the result of the right-shift with a constant derived from an irreducible polynomial associated with the $2^8$ Galois field, to compensate the result of the right-shift if the LSB of the data byte is the predetermined logic state.

5. The apparatus of claim 4, wherein the processor and memory are further configured to:

compute the m erasure code syndromes based on an 8-bit Galois field polynomial 0x11D, where 0x denotes that 11D is in hexadecimal form; and bit-wise XOR the result of the right-shift with hexadecimal value 8E if the LSB of the data byte is the predetermined logic state.

6. The apparatus of claim 1, wherein the processor and memory are further configured to:

compute, in the Galois field, the product of the data byte and the coefficient x as a left-shift of the data byte; and compensate a result of the left-shift if a most significant bit (MSB) of the data byte is a predetermined one of multiple logic states.

7. The apparatus of claim 6, wherein the processor and memory are further configured to:

compensate the result of the left-shift with a constant derived from an irreducible polynomial associated with the Galois field if the MSB of the data byte is the predetermined logic state.

8. The apparatus of claim 7, wherein the Galois field is a $2^8$ Galois field, and wherein the processor and memory are further configured to:

compute the product of the data byte and the coefficient x as an 8-bit left-shift of the data byte; and bit-wise XOR the result of the left-shift with a constant derived from an irreducible polynomial associated with the $2^8$ Galois field, to compensate the result of the left-shift if the MSB of the data byte is the predetermined logic state.

9. The apparatus of claim 8, wherein the processor and memory are further configured to:

compute the m erasure code syndromes based on an 8-bit Galois field polynomial 0x11D, where 0x denotes that 11D is in hexadecimal form; and bit-wise XOR the result of the left-shift with hexadecimal value 1D if the MSB of the data byte is the predetermined logic state.

10. The apparatus of claim 1, wherein the processor and memory are further configured to:

compute the m erasure code syndromes for m greater than 2 with coefficient exponents that consist of integer values −1, 0, and 1.

11. The apparatus of claim 1, wherein one of the k storage units includes a redundant array of l independent storage units, and wherein the processor and memory are further configured to:

compute n erasure code syndromes based on Reed Solomon (RS) operations in a Galois field and data distributed over the l storage units; and reconstruct data of up to n of the l storage units based on the n erasure code syndromes and data stored in remaining ones of the l storage units, where l and n are positive integers, wherein n is greater than 2, and wherein l is greater than n.

12. The apparatus of claim 11, wherein the processor and memory are further configured to:

compute the n erasure code syndromes for n greater than 2 with coefficient exponents that consist of integer values −1, 0, and 1.

13. A non-transitory computer readable medium encoded with a computer program, including instructions to cause a processor to:

compute m erasure code syndromes based on Reed Solomon (RS) operations in a Galois field and data distributed over k storage units, wherein at least one of the m erasure code syndromes includes a coefficient of exponent negative one ($x^{-1}$) and a coefficient of exponent positive one (x), including to compute, in the Galois field, one or more of, a product of a data byte and the coefficient $x^{-1}$ as a right-shift of the data byte, and a product of the data byte and the coefficient x as a left-shift of the data byte; and reconstruct data of up to m of the k storage units based on the m erasure code syndromes and data stored in remaining ones of the k storage units, where k and m are positive integers and m is greater than 2, and wherein k is greater than m.

14. The computer readable medium of claim 13, further including instructions to cause the processor to:

compute, in the Galois field, the product of the data byte and the coefficient $x^{-1}$ as a right-shift of the data byte; and compensate a result of the right-shift if a least significant bit (LSB) of the data byte is a predetermined one of multiple logic states.

15. The computer readable medium of claim 14, further including instructions to cause the processor to:

compensate the result of the right-shift with a constant derived from an irreducible polynomial associated with the Galois field, if the LSB of the data byte is the predetermined logic state.

16. The computer readable medium of claim 15, wherein the Galois field is a $2^8$ Galois field, further including instructions to cause the processor to:

perform the right shift as an 8-bit right-shift of the data byte; and bit-wise XOR the result of the right-shift with a constant derived from an irreducible polynomial associated with the $2^8$ Galois field, to compensate the result of the right-shift if the LSB of the data byte is the predetermined logic state.

17. The computer readable medium of claim 16, further including instructions to cause the processor to:

compute the m erasure code syndromes based on an 8-bit Galois field polynomial 0x11D, where 0x denotes that 11D is in hexadecimal form; and bit-wise XOR the result of the right-shift with hexadecimal value 8E if the LSB of the data byte is the predetermined logic state.

18. A method, comprising:

computing m erasure code syndromes based on Reed Solomon (RS) operations in a Galois field and data distributed over k storage units, wherein at least one of the m erasure code syndromes includes a coefficient of exponent negative one ($x^{-1}$) and a coefficient of exponent positive one (x), and wherein the computing includes one or more of, computing, in the Galois field, a product of a data byte and the coefficient $x^{-1}$ as a right-shift of the data byte, and computing, in the Galois field, a product of the data byte and the coefficient x as a left-shift of the data byte; and reconstructing data of up to m of the k storage units based on the m erasure code syndromes and data stored in remaining ones of the k storage units, where k and m are positive integers, wherein m is greater than 2, and wherein k is greater than m.

19. The method of claim 18, wherein the computing further includes:

the computing, in the Galois field, a product of a data byte and the coefficient $x^{-1}$ as a right-shift of the data byte; and compensating a result of the right-shift if a least significant bit (LSB) of the data byte is a predetermined one of multiple logic states.

20. The method of claim 19, wherein the compensating includes:

compensating the result of the right-shift with a constant derived from an irreducible polynomial associated with the Galois field, if the LSB of the data byte is the predetermined logic state.

21. The method of claim 20, wherein:

the computing further includes computing the m erasure code syndromes based on an 8-bit Galois field polynomial 0x11D, where 0x denotes that 11D is in hexadecimal form; and the compensating includes bit-wise XORing the result of the right-shift with hexadecimal value 8E if the LSB of the data byte is the predetermined logic state.

22. The method of claim 18, wherein the computing includes:

the computing, in the Galois field, a product of the data byte and the coefficient x as a left-shift of the data byte, and compensating a result of the left-shift if a most significant bit (MSB) of the data byte is a predetermined one of multiple logic states.

23. The method of claim 22, wherein the compensating includes:

compensating the result of the left-shift with a constant derived from an irreducible polynomial associated with the Galois field if the MSB of the data byte is the predetermined logic state.

24. The method of claim 23, wherein:

the computing further includes computing the syndromes based on an 8-bit Galois field polynomial 0x11D, where 0x denotes that 11D is in hexadecimal form; and bit-wise XORing the result of the left-shift with hexadecimal value 1D if the MSB of the data byte is the predetermined logic state.

25. The method of claim 18, wherein the computing further includes:

computing the m erasure code syndromes for m greater than 2 with coefficient exponents that consist of integer values −1, 0, and 1.

* * * * *